(12) United States Patent
Yoshifusa

(10) Patent No.: US 8,693,202 B2
(45) Date of Patent: Apr. 8, 2014

(54) FLEXIBLE PRINTED CIRCUIT AND TOUCHSCREEN

(75) Inventor: Kazuyuki Yoshifusa, Tokyo (JP)

(73) Assignee: Fujitsu Component Limited, Tokyo (JP)

( * ) Notice: Subject to any disclaimer, the term of this patent is extended or adjusted under 35 U.S.C. 154(b) by 145 days.

(21) Appl. No.: 13/547,187

(22) Filed: Jul. 12, 2012

(65) Prior Publication Data
US 2013/0044443 A1 Feb. 21, 2013

(30) Foreign Application Priority Data
Aug. 17, 2011 (JP) .................. 2011-178626

(51) Int. Cl.
*H05K 1/00* (2006.01)
(52) U.S. Cl.
USPC ........... 361/749; 361/750; 361/751; 361/760; 174/254; 174/260; 174/261; 174/268
(58) Field of Classification Search
CPC .......... H05K 1/118; H05K 2201/2009; H05K 3/326; G06F 3/041; G06F 2203/04103; G02F 1/133
USPC .......... 361/749, 750, 751, 760; 174/254, 260, 174/261, 268; 345/173
See application file for complete search history.

(56) References Cited

U.S. PATENT DOCUMENTS

| | | |
|---|---|---|
| 6,027,366 A | 2/2000 | Mori et al. |
| 2005/0088830 A1* | 4/2005 | Yumoto et al. ............... 361/749 |
| 2008/0148559 A1* | 6/2008 | Nickerson et al. ............ 29/832 |
| 2008/0149372 A1* | 6/2008 | Choi et al. .................... 174/254 |
| 2009/0168362 A1* | 7/2009 | Clayton et al. ............... 361/714 |
| 2010/0093247 A1* | 4/2010 | Jiang et al. ..................... 445/24 |

FOREIGN PATENT DOCUMENTS

| | | |
|---|---|---|
| JP | 7-288371 | 10/1995 |
| JP | 2006-041044 | 2/2006 |
| KR | 10-2010-0048528 | 5/2010 |

* cited by examiner

*Primary Examiner* — Robert J Hoffberg
*Assistant Examiner* — Robert Brown
(74) *Attorney, Agent, or Firm* — IPUSA, PLLC

(57) ABSTRACT

A flexible printed circuit includes a first flexible film; a first interconnection layer on the first flexible film, wherein the first interconnection layer includes a first end portion to be connected to a first electrode of a touchscreen, and a second end portion; a second flexible film; a second interconnection layer on the second flexible film, wherein the second interconnection layer includes a first end portion to be connected to a second electrode of the touchscreen, and a second portion; an adhesive layer that bonds the first flexible film and the second flexible film; a first cover film on the first interconnection layer with the first and second end portions of the first interconnection layer being exposed; and a second cover film on the second interconnection layer with the first and second end portions of the second interconnection layer being exposed.

8 Claims, 13 Drawing Sheets

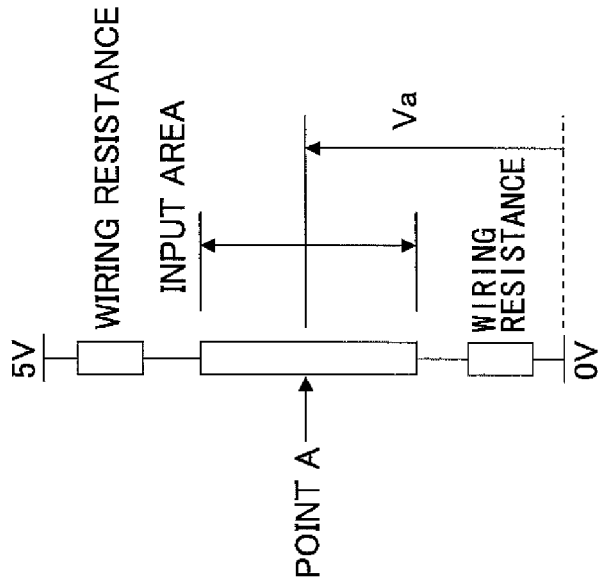
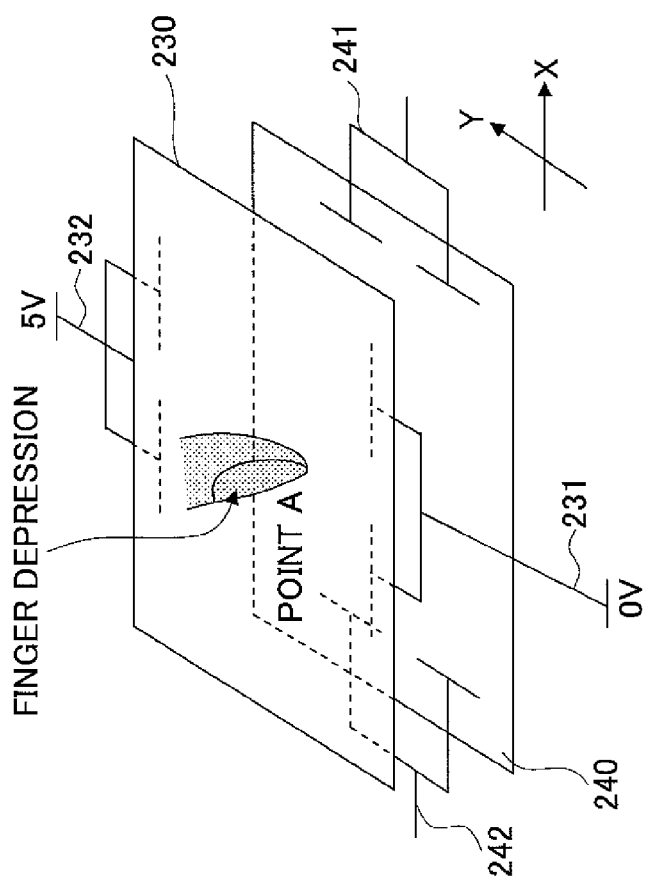

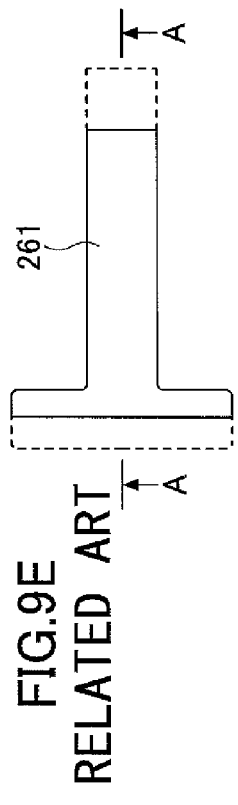
FIG.9E RELATED ART
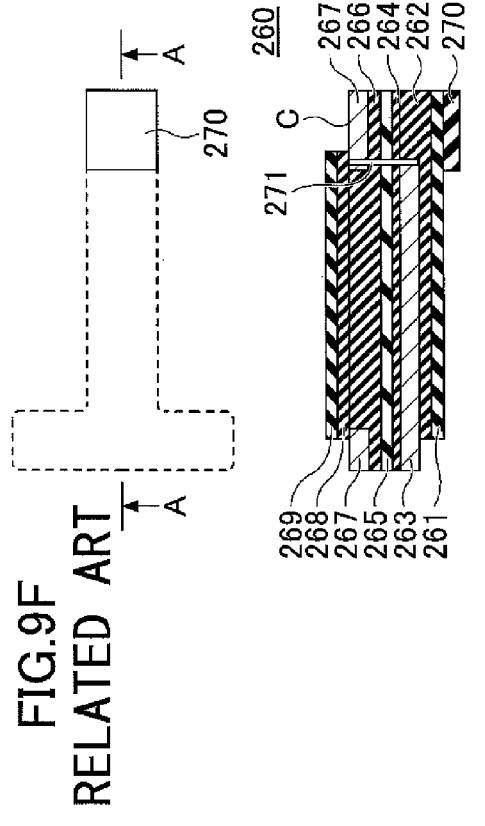
FIG.9F RELATED ART
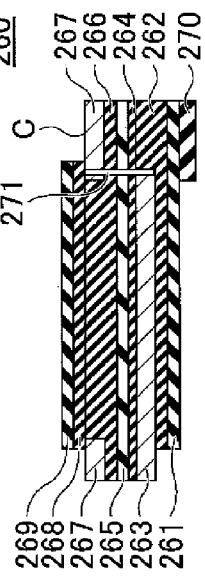
FIG.9G RELATED ART
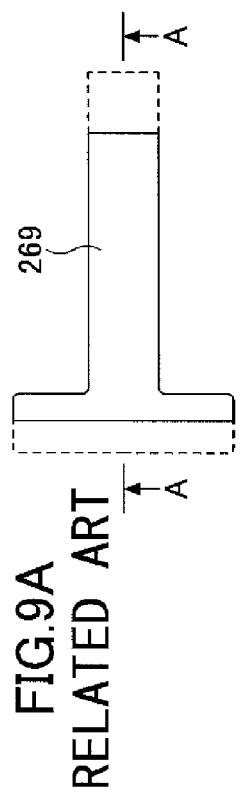
FIG.9A RELATED ART
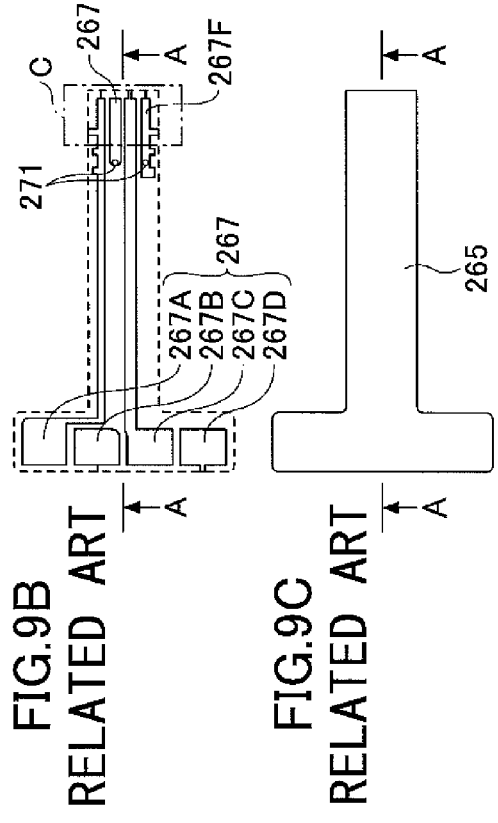
FIG.9B RELATED ART
FIG.9C RELATED ART
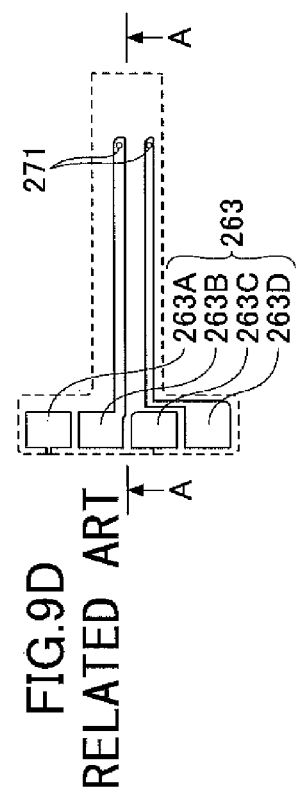
FIG.9D RELATED ART

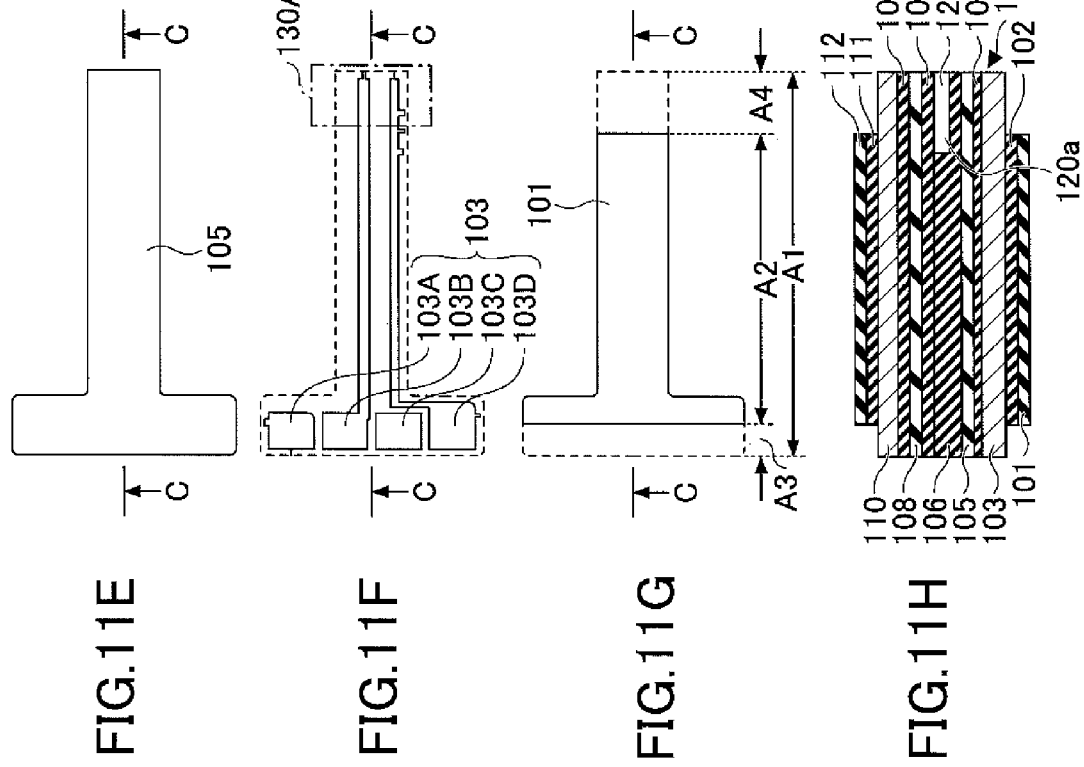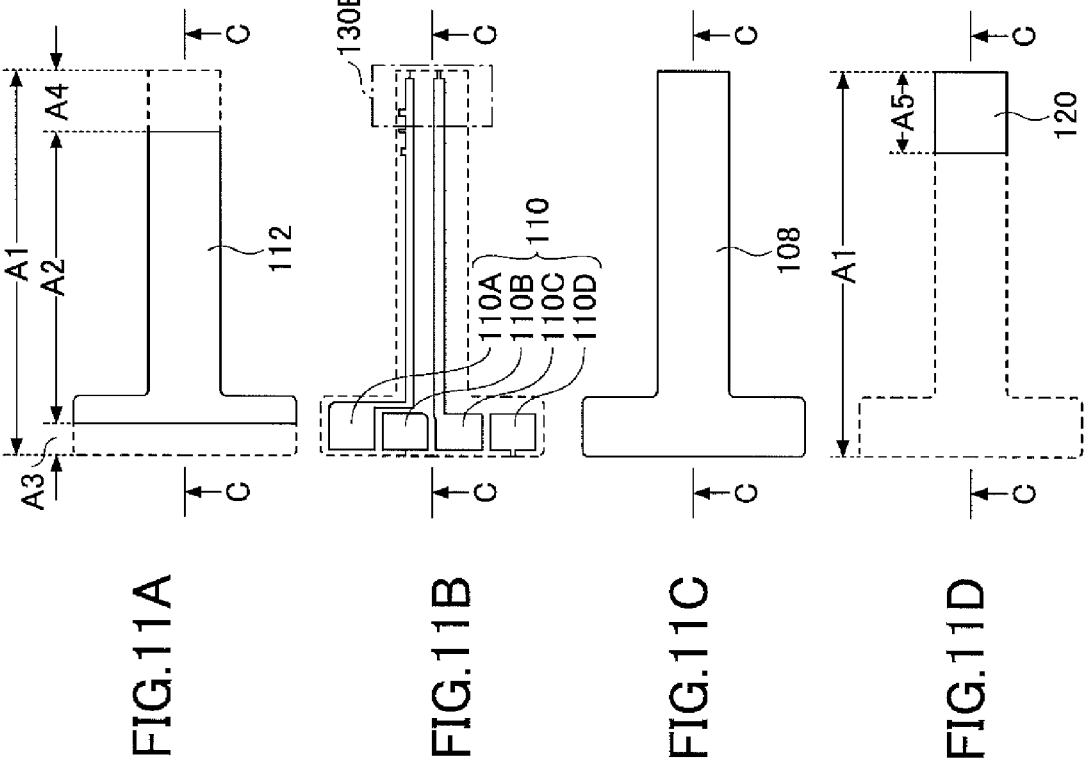

FLEXIBLE PRINTED CIRCUIT AND TOUCHSCREEN

CROSS-REFERENCE TO RELATED APPLICATION

The present application is based upon and claims the benefit of priority of Japanese Patent Application No. 2011-178626, filed on Aug. 17, 2011, the entire contents of which are incorporated herein by reference.

BACKGROUND OF THE INVENTION

1. Field of the Invention

A certain aspect of the embodiments discussed herein is related to a flexible printed circuit (FPC) and a touchscreen.

2. Description of the Related Art

A touchscreen, which is an input device that allows direct input to a display, is provided at the front surface of the display and used. The touchscreen allows direct input to the display based on the information viewed on the display. Therefore, the touchscreen has been used for a wide variety of purposes.

A popular touchscreen is a resistive (resistive film) touchscreen. The resistive touchscreen includes an upper electrode substrate and a lower electrode substrate, which are so provided that their respective electrically-conductive transparent films face each other. By applying a force on the upper electrode substrate at one point, the respective electrically-conductive transparent films come into contact to cause a position to which the force is applied to be detected.

The electrically-conductive transparent films of the upper electrode substrate and the lower electrode substrate of the touchscreen are connected to a coordinates detecting part configured to detect the coordinates of a contact position via, for example, interconnects formed of a flexible printed circuit.

Various kinds of flexible printed circuits are available. (See, for example, Japanese Laid-Open Patent Application No. 7-288371.)

SUMMARY OF THE INVENTION

According to an aspect of the present invention, a flexible printed circuit includes a first flexible film; a first interconnection layer on the first flexible film, wherein the first interconnection layer includes a first end portion to be connected to a first electrode of a touchscreen, and a second end portion; a second flexible film; a second interconnection layer on the second flexible film, wherein the second interconnection layer includes a first end portion to be connected to a second electrode of the touchscreen, and a second portion; an adhesive layer that bonds the first flexible film and the second flexible film; a first cover film on the first interconnection layer with the first and second end portions of the first interconnection layer being exposed; and a second cover film on the second interconnection layer with the first and second end portions of the second interconnection layer being exposed.

According to an aspect of the present invention, a touchscreen includes a flexible printed circuit; a first electrode substrate that includes a first substrate and a first electrode formed on the first substrate; and a second electrode substrate that includes a second substrate and a second electrode formed on the second substrate, wherein the flexible printed circuit includes a first flexible film; a first interconnection layer on the first flexible film, wherein the first interconnection layer includes a first end portion connected to the first electrode, and a second end portion; a second flexible film; a second interconnection layer on the second flexible film, wherein the second interconnection layer includes a first end portion connected to the second electrode, and a second portion; an adhesive layer that bonds the first flexible film and the second flexible film; a first cover film on the first interconnection layer with the first and second end portions of the first interconnection layer being exposed; and a second cover film on the second interconnection layer with the first and second end portions of the second interconnection layer being exposed.

The object and advantages of the embodiments will be realized and attained by means of the elements and combinations particularly pointed out in the claims.

It is to be understood that both the foregoing general description and the following detailed description are exemplary and explanatory and not restrictive of the invention.

BRIEF DESCRIPTION OF THE DRAWINGS

Other objects, features and advantages of the present invention will become more apparent from the following detailed description when read in conjunction with the accompanying drawings, in which:

FIGS. 3A and 3B are diagrams illustrating the principle of detecting a contact position on the four-wire touchscreen of the comparative example;

FIGS. 9A through 9G are diagrams illustrating a flexible printed circuit of the comparative example for four-wire touchscreens;

FIGS. 11A through 11H are diagrams illustrating a flexible printed circuit for four-wire touchscreens according to a first embodiment;

DETAILED DESCRIPTION OF THE PREFERRED EMBODIMENTS

The touchscreen may be installed in a limited space. Typical examples of such installation include installation in electronic devices such as smartphones and small-size game consoles.

In the case of installation into a limited space, it is often the case that the interconnects of flexible printed circuits are forced to bend to a large degree. Unfortunately, however, the conventional flexible printed circuits do not have sufficient strength in such a case.

According to an aspect of the present invention, a flexible printed circuit and a touchscreen are provided that have high strength.

A description is given below of embodiments in which a flexible printed circuit and a touchscreen according to an aspect of the present invention are applied.

Before giving a description of flexible printed circuits and touchscreens according to embodiments of the present invention, a description is given, with reference to FIG. 1, FIG. 2, FIGS. 3A and 3B, and FIGS. 4A and 4B, of a touchscreen of a comparative example.

Resistive touchscreens may be roughly classified into a four-wire type and a five-wire type. The four-wire type has x-axis electrodes provided on one of the upper electrode substrate and the lower electrode substrate and y-axis electrodes provided on the other of the upper electrode substrate and the lower electrode substrate. The five-wire type has both x-axis and y-axis electrodes provided on the lower electrode substrate, and the upper electrode substrate serves as a probe for detecting voltage.

Figure 1:
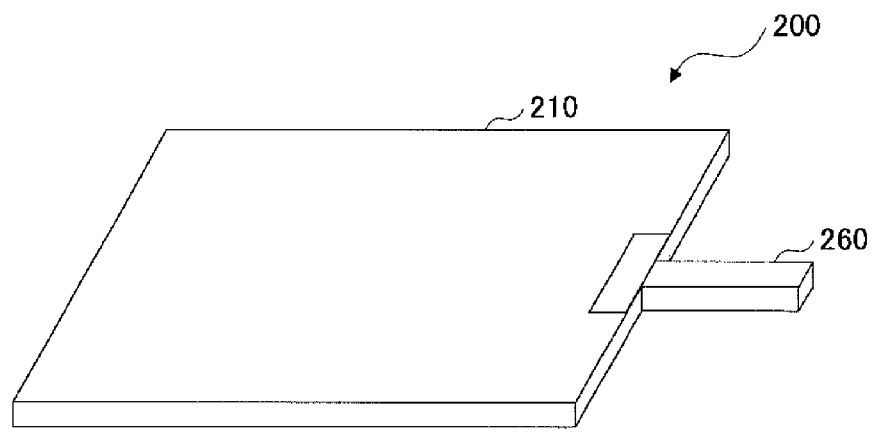
FIG. 1 is a perspective view of a touchscreen of a comparative example.
Figure 2:
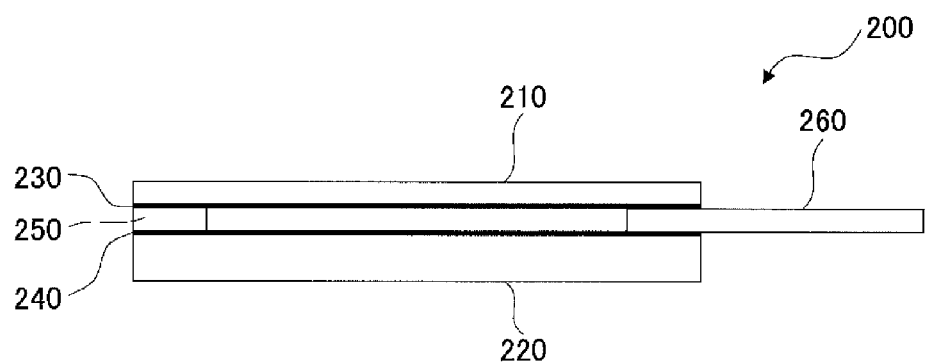
FIG. 2 is a schematic cross-sectional view of the touchscreen of the comparative example.

A description is given, with reference to FIG. 1 and FIG. 2, of a touchscreen 200 of a comparative example. FIG. 1 is a perspective view of the touchscreen 200, and FIG. 2 is a schematic cross-sectional view of the touchscreen 200.

The touchscreen 200 illustrated in FIG. 1 and FIG. 2 is a four-wire or five-wire touchscreen. It does not make a difference in exterior whether the touchscreen 200 is a four-wire type or a five-wire type. Therefore, a description is given of both the four-wire type and the five-wire type using the same touchscreen 200.

The touchscreen 200 includes a film 210 having an electrically-conductive transparent film 230 formed on one of its surfaces and a glass substrate 220 having an electrically-conductive transparent film 240 formed on one of its surfaces. The film 210 with the electrically-conductive transparent film 230 serves as an upper electrode substrate. The glass substrate 220 with the electrically-conductive transparent film 240 serves as a lower electrode substrate. The film 210 with the electrically-conductive transparent film 230 and the glass substrate 220 with the electrically-conductive transparent film 240 are provided so that the electrically-conductive transparent films 230 and 240 face each other across a spacer 250. The touchscreen 200 is electrically connected to a host computer (not graphically illustrated) via a flexible printed circuit (FPC) 260.

The touchscreen 200 operates as follows if the touchscreen 200 is a four-wire type. Voltage is applied to the touchscreen 200 alternately in the x-axis directions and in the y-axis directions using electrodes 231 and 232 provided at two ends of the electrically-conductive transparent film 230 to run along its two opposite sides and electrodes 241 and 242 provided at two ends of the electrically-conductive transparent film 240 to run along its two opposite sides, as illustrated in FIG. 3A. When the electrically-conductive transparent film 230 and the electrically-conductive transparent film 240 come into contact at a contact point A, a potential Va is detected via the electrically-conductive transparent film 230 as illustrated in FIG. 3B, so that a coordinate position is detected in each of the x-axis directions and the y-axis directions.

Figure 4A:
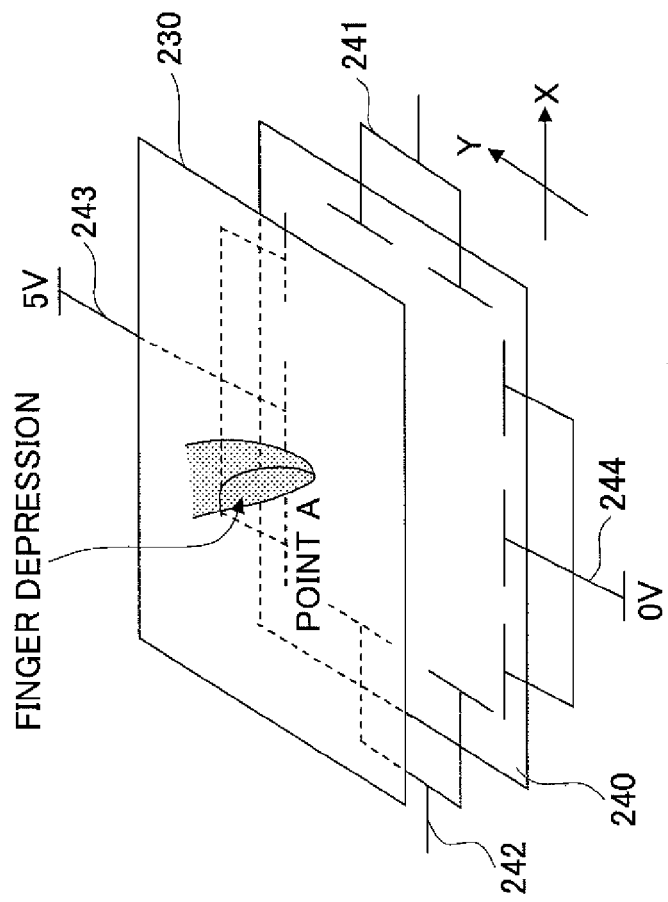
FIGS. 4A and 4B are diagrams illustrating the principle of detecting a contact position on the five-wire touchscreen of the comparative example.
Figure 4B:
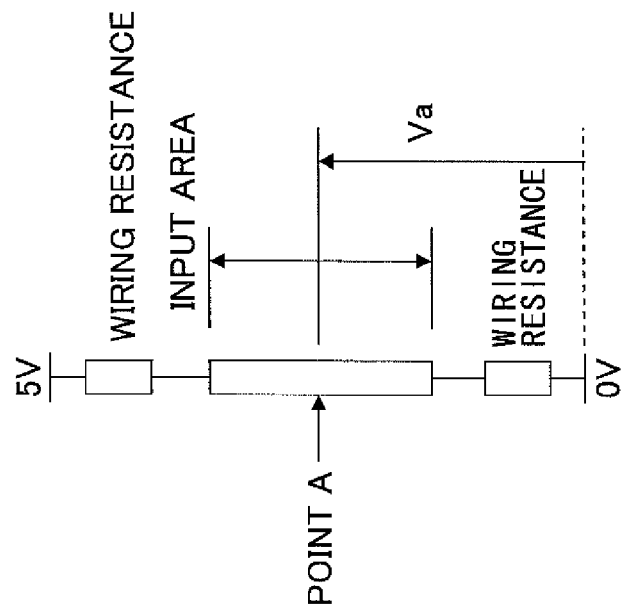

The touchscreen 200 operates as follows if the touchscreen 200 is a five-wire type. Voltage is applied to the touchscreen 200 alternately in the x-axis directions and in the y-axis directions using the electrodes 241 and 242 and electrodes 243 and 244 provided at four ends of the electrically-conductive transparent film 240 to run along its four sides as illustrated in FIG. 4A. When the electrically-conductive transparent film 230 and the electrically-conductive transparent film 240 come into contact at a contact point A, a potential Va is detected via the electrically-conductive transparent film 230 as illustrated in FIG. 4B, so that a coordinate position is detected in each of the x-axis directions and the y-axis directions.

Next, a description is given, with reference to FIG. 5, FIG. 6, FIG. 7 and FIG. 8, of the touchscreen 200 of the comparative example in the case of employing a multi-touch system.

Figure 5:
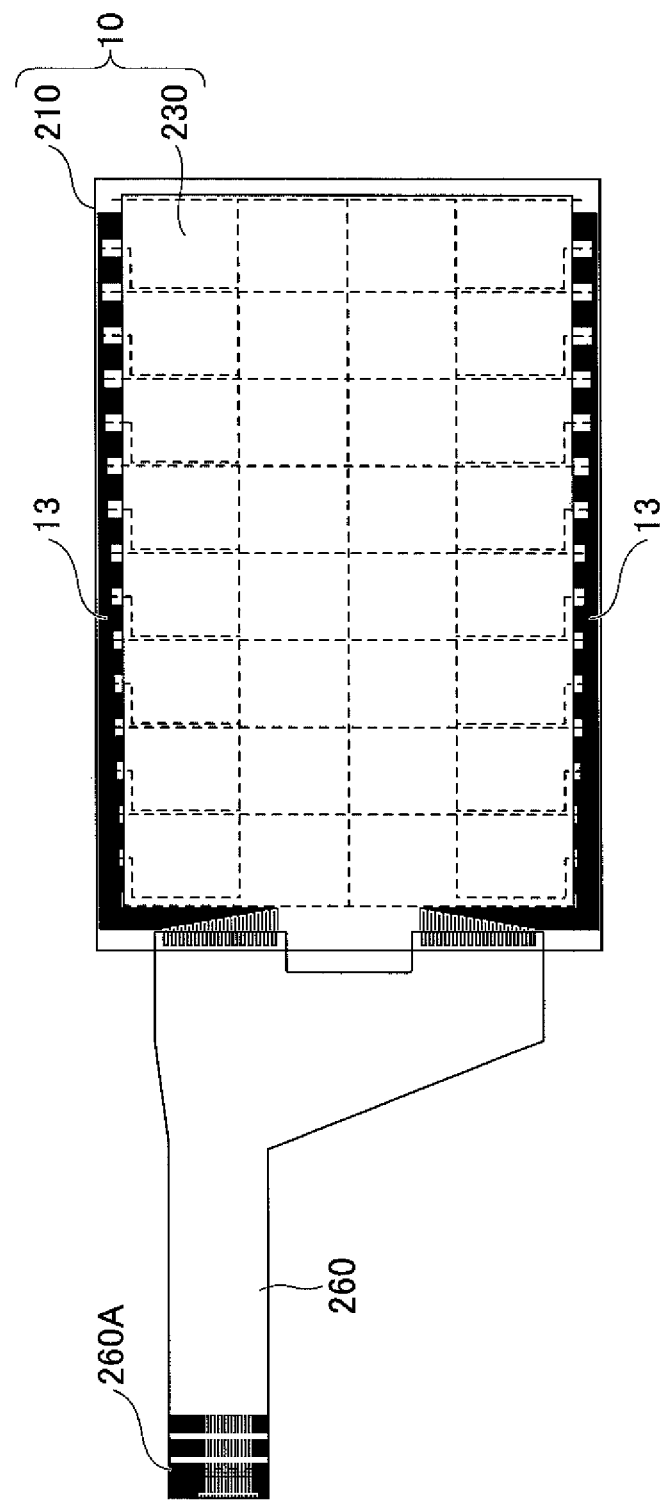
FIG. 5 is a diagram illustrating a structure of an upper electrode substrate of the touchscreen of the comparative example.
Figure 6:
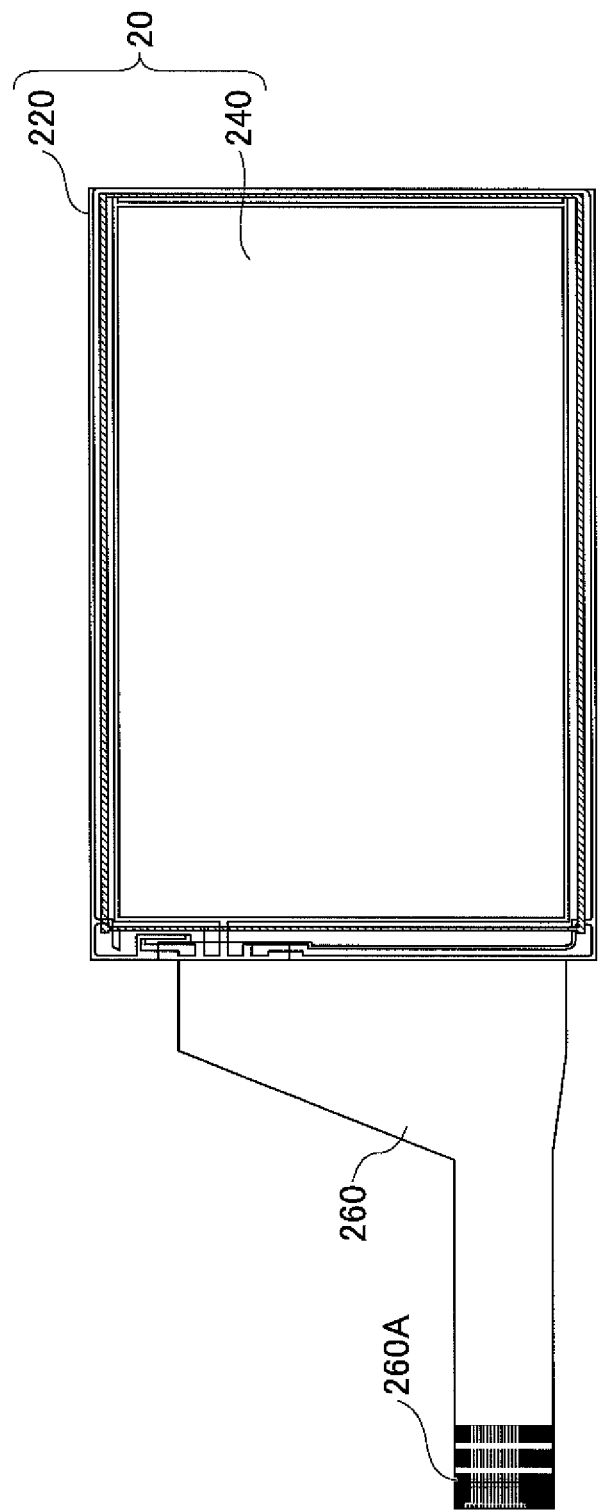
FIG. 6 is a diagram illustrating a structure of a lower electrode substrate of the touchscreen of the comparative example.
Figure 7:
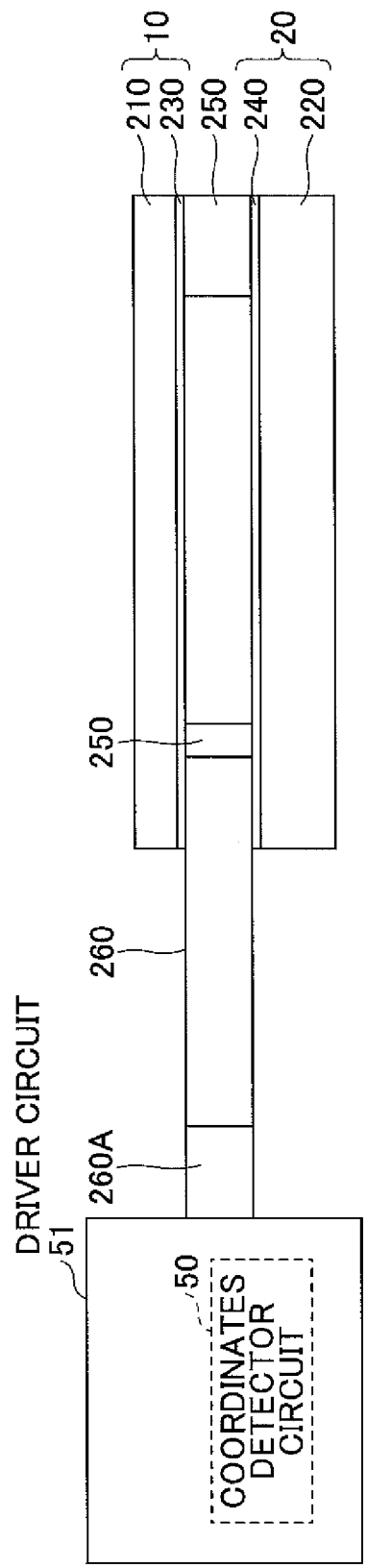
FIG. 7 is a cross-sectional view of the touchscreen of the comparative example.
Figure 8:
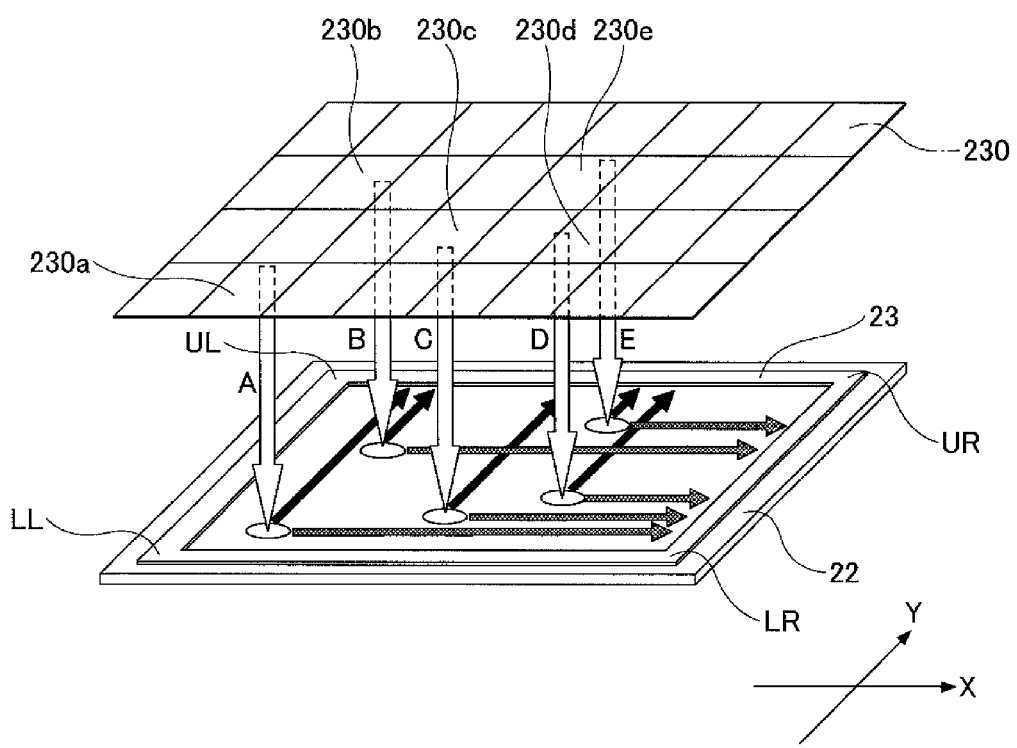
FIG. 8 is a diagram illustrating the touchscreen of the comparative example.

FIG. 5 is a diagram illustrating a structure of the upper electrode substrate of the touchscreen 200 of the comparative example. FIG. 6 is a diagram illustrating a structure of the lower electrode substrate of the touchscreen 200 of the comparative example. FIG. 7 is a cross-sectional view of the touchscreen 200 of the comparative example. FIG. 8 is a diagram illustrating the touchscreen 200 of the comparative example. It is assumed that the touchscreen 200 illustrated in FIG. 5 through FIG. 8 is a five-wire type.

The touchscreen 200 of the comparative example includes a substantially rectangular upper electrode substrate 10 having the electrically conductive transparent film 230 formed on one of the surfaces of the film 210 and a lower electrode substrate 20 having the electrically-conductive transparent film 240 formed on one of the surfaces of the glass substrate 220. The lower electrode substrate 20 is substantially equal in shape to the upper electrode substrate 10.

The touchscreen 200 further includes a driver circuit 51 including a coordinated detector circuit 50. The coordinates detector circuit 50 and the driver circuit 51 illustrated in FIG. 7 are examples and are not limited to the configuration illustrated in FIG. 7.

The upper electrode substrate 10 and the lower electrode substrate 20 are joined to the spacer 250, interposed between the upper electrode substrate 10 and the lower electrode substrate 20, with an adhesive agent or double-sided tape, so that the electrically-conductive transparent film 230 in the upper electrode substrate 10 and the electrically-conductive transparent film 240 in the lower electrode substrate 20 face each other.

The electrically-conductive transparent film 230 is divided into individual electrically conductive regions by removing portions of the electrically-conductive transparent film 230 between regions to become electrically conductive regions. This allows the individual electrically conductive regions to be electrically isolated from each other. The electrically conductive regions into which the electrically-conductive transparent film 230 is divided are connected to lead-out electrodes in a lead-out electrode part 13 provided one at each end of the upper electrode substrate 10 in directions along its shorter sides (shorter-side directions), so as to be connected to the flexible printed circuit 260 at one end of the upper electrode substrate 10 in directions along its longer sides (longer-side directions) through the periphery of the upper electrode substrate 10. A terminal 260A is connected to one end of the flexible printed circuit 260. The terminal 260A is connected to the driver circuit 51 including the coordinates detector circuit 50 (FIG. 7).

The flexible printed circuit 260 has interconnects formed on each of a surface on the side illustrated in FIG. 5 and a surface on the side illustrated in FIG. 6, so that the terminal 260A is a double-sided contact terminal having terminals on each surface.

The lower electrode substrate 20 has a rectangular frame-shaped electrode 23 provided on the electrically-conductive transparent film 240 in the peripheral portion of the lower electrode substrate 20 (that is, at the four ends of the lower electrode substrate 20 along its four sides) as illustrated in FIG. 8. The electrode 23 is formed of, for example, a Ag or Ag—C resistive film, and has four vertex parts LL, LR, UL, and UR, which are connected to respective lead-out lines for controlling electric potential at the vertex parts LL, LR, UL, and UR. These lead-out lines are led out from the periphery of the lower electrode substrate 20 to be connected to the flexible printed circuit 260 at one end of the lower electrode substrate 20 in the lengthwise (longer-side) directions of the lower electrode substrate 20 as illustrated in FIG. 6.

The terminal 260A of the flexible printed circuit 260 is connected to the driver circuit 51 and further to a host computer (not graphically illustrated). Examples of the material of the electrically-conductive transparent film 230 and the electrically-conductive transparent film 240 include ITO (indium tin oxide), Al or Ga-doped ZnO (zinc oxide), Sb-doped $SnO_2$ (tin oxide) and the like.

Examples of the material of the film 210 include polyethylene terephthalate (PET), polycarbonate (PC), and resin materials transparent in the visible region. Further, the glass substrate 220 may be replaced with a resin substrate.

According to the touchscreen 200 of the comparative example, depressing the upper electrode substrate 10 with a finger or the like causes the electrically-conductive transparent film 230 in the upper electrode substrate 10 and the electrically-conductive transparent film 240 in the lower electrode substrate 20 to come into contact with each other, and the position of contact of the upper electrode substrate 10 and the lower electrode substrate 20, where the upper electrode substrate 10 is depressed with a finger or the like, is determined (identified) by detecting a voltage at the position of contact. For example, in the upper electrode substrate 10, the electrically conductive regions into which the electrically-conductive transparent film 230 is divided are subjected to time-division scanning, so that it is possible to identify an electrically conductive region including the position of contact based on the time of contact.

In the lower electrode substrate 20, voltage is applied to the electrically-conductive transparent film 240 alternately in the x-axis directions and in the y-axis directions by controlling voltage applied from the driver circuit 51 to the vertex parts LL, LR, UL, and UR of the rectangular frame-shaped electrode 23 provided on the electrically-conductive transparent film 240.

Thus, dividing the electrically-conductive transparent film 230 into multiple electrically conductive regions in the upper electrode substrate 10 makes it possible to identify, in the coordinates detector circuit 50, a contact position on an individual region basis in the divided electrically-conductive transparent film 230. Therefore, even when the upper electrode substrate 10 and the lower electrode substrate 20 come into contact at multiple positions (points), it is possible to detect the contact positions independent of each other.

That is, even when the electrically-conductive transparent film 230 in the upper electrode substrate 10 and the electrically-conductive transparent film 240 in the lower electrode substrate 20 are in contact at five positions (points) indicated by arrows A, B, C, D and E as illustrated in FIG. 8, it is possible to detect the contact positions independent of each other because the contact positions are in different regions in the divided electrically-conductive transparent film 230.

For example, at the contact position indicated by arrow A, the upper electrode substrate 10 and the lower electrode substrate 20 are in contact in an electrically conductive region 230a of the electrically-conductive transparent film 230. At the contact position indicated by arrow B, the upper electrode substrate 10 and the lower electrode substrate 20 are in contact in an electrically conductive region 230b of the electrically-conductive transparent film 230. At the contact position indicated by arrow C, the upper electrode substrate 10 and the lower electrode substrate 20 are in contact in an electrically conductive region 230c of the electrically-conductive transparent film 230. At the contact position indicated by arrow D, the upper electrode substrate 10 and the lower electrode substrate 20 are in contact in an electrically conductive region 230d of the electrically-conductive transparent film 230. At the contact position indicated by arrow E, the upper electrode substrate 10 and the lower electrode substrate 20 are in contact in an electrically conductive region 230e of the electrically-conductive transparent film 230.

Since the electrically conductive regions 230a, 230b, 230c, 230d, and 230e of the electrically-conductive transparent film 230 are mutually isolated different regions, it is possible to detect the electrically conductive regions 230a, 230b, 230c, 230d, and 230e independent of one another. Therefore, even when the upper electrode substrate 10 and the lower electrode substrate 20 are in contact at five positions, it is possible to identify the individual contact positions.

Thus, even when the electrically-conductive transparent film 230 and the electrically-conductive transparent film 240 are in contact at multiple positions (points), it is possible to identify individual electrically conductive regions where the contact is made. Further, by detecting a potential distribution in the electrically-conductive transparent film 240, it is possible to detect coordinate positions with more accuracy. Further, it is also possible to recognize the movement of the contact position of the electrically-conductive transparent film 230 and the electrically-conductive transparent film 240 when the contact position is caused to move. By detecting a potential distribution in the electrically-conductive transparent film 240, it is also possible to detect the coordinate position of the contact position that has moved.

FIGS. 9A through 9G are diagrams illustrating the flexible printed circuit 260 of the comparative example. FIGS. 9A through 9F are plan views of individual layers of the flexible printed circuit 260. FIG. 9G is a cross-sectional view of the flexible printed circuit 260 taken along a plane indicated by arrows A in FIGS. 9A through 9F. By way of example, the flexible printed circuit 260 is for four-wire touchscreens.

As illustrated in FIG. 9G, the flexible printed circuit 260 includes a cover film 261, an adhesive layer 262, an interconnection part 263, an adhesive layer 264, a base film 265, an adhesive layer 266, an interconnection part 267, an adhesive layer 268, a cover film 269, and an reinforcement part 270.

The cover film 261, the adhesive layer 262, the interconnection part 263, the adhesive layer 264, the base film 265, the adhesive layer 266, the interconnection part 267, the adhesive layer 268, and the cover film 269 are stacked in layers in this order. The reinforcement part 270 is bonded to the surface of the cover film 261.

The cover film 261, which is a flexible film that covers a surface (a lower surface in FIG. 9G) of the interconnection part 263, is formed of, for example, a polyimide film. The cover film 261 is bonded to the interconnection part 263 with the adhesive layer 262. As illustrated in FIG. 9E, the cover film 261 has a T-letter shape in a plan view.

The adhesive layer 262, which is formed of, for example, an acrylic or epoxy adhesive agent, bonds the cover film 261 and the interconnection part 263 together. The adhesive layer 262 adheres to the adhesive layer 264 above the reinforcement part 270.

The interconnection part 263, which is formed of, for example, copper foil, connects the electrically-conductive transparent film 240 of the touchscreen 200 and the driver circuit 51 including the coordinates detector circuit 50. As illustrated in FIG. 9D, the interconnection part 263 includes four interconnect parts 263A, 263B, 263C, and 263D.

Of the interconnect parts 263A through 263D, the interconnect parts 263A and 263C are dummies. The interconnect parts 263B and 263C are connected to interconnect parts 267E and 267F illustrated in FIG. 9B, respectively, via through holes 271 at their respective right ends in FIG. 9D.

The adhesive layer 264, which is formed of, for example, an acrylic or epoxy adhesive agent, bonds the interconnection part 263 and the base film 265 together.

The base film 265, which is a film that serves as the base material of the flexible printed circuit 260, is formed of, for example, a polyimide film. The interconnection parts 263 and 267 are bonded to the (lower and upper) surfaces of the base film 265 with the adhesive layers 264 and 266, respectively. The base film 265 is bonded to the cover film 261 with the adhesive layers 262 and 264 above the reinforcement part 270. Further, the base film 265 is bonded to the cover film 269 with the adhesive layers 266 and 268 in the center part of the cross section illustrated in FIG. 9G. As illustrated in FIG. 9C, the base film 265 has a T-letter shape in a plan view.

The adhesive layer 266, which is formed of, for example, an acrylic or epoxy adhesive agent, bonds the base film 265 and the interconnection part 267 together. The adhesive layer 266 connects (bonds) the base film 265 and the cover film 269 together in the center part of the cross section illustrated in FIG. 9G.

The interconnection part 267, which is formed of, for example, copper foil, connects the electrically-conductive transparent film 230 of the touchscreen 200 and the driver circuit 51 including the coordinates detector circuit 50. As illustrated in FIG. 9B, the interconnection part 267 includes interconnect parts 267A, 267B, 267C, and 267D and the interconnect parts 267E and 267F.

The interconnect parts 267E and 267F are connected to the interconnect parts 263B and 263D illustrated in FIG. 9D, respectively, with the through holes 271 on the right side in FIG. 9B.

A connector part C of the flexible printed circuit 260, which is indicated by a one-dot chain line in FIG. 9B, is connected to the driver circuit 51.

The adhesive layer 268 bonds the interconnection part 267 and the cover film 269 together.

The cover film 269, which is a flexible film that covers a surface (an upper surface in FIG. 9G) of the interconnection part 267, is formed of, for example, a polyimide film. The cover film 269 is bonded to the interconnection part 267 and the base film 265 with the adhesive layer 266. As illustrated in FIG. 9A, the cover film 269 has a T-letter shape in a plan view.

The through holes 271 are formed in the flexible printed circuit 260. The through holes 271 connect the interconnection part 267 illustrated in FIG. 9B and the interconnection part 263 illustrated in FIG. 9D. As illustrated in FIG. 9G, the through holes 271 are formed through the interconnection part 263, the adhesive layer 264, the base film 265, the adhesive layer 266, and the interconnection part 267. Cylindrical copper foil is formed on the respective inner wall surfaces of the through holes 271 to achieve the interlayer connection of the interconnection part 263 and the interconnection part 267.

The reinforcement part 270 is bonded to the lower surface of the cover film 261 at its one end (the right end in FIG. 9G, see also FIG. 9F.) The reinforcement part 270 is formed of, for example, urethane rubber.

The flexible printed circuit 260 illustrated in FIG. 9G has its left end portion (in FIG. 9G) attached by pressure between the film 210 and the glass substrate 220 of the touchscreen 200 (FIG. 1 and FIG. 2).

The interconnect parts 267A and 267C have respective left end portions connected to the electrodes 231 and 232 (FIG. 3A), respectively, provided at two ends of the electrically-conductive transparent film 230 of the touchscreen 200 to run along its two opposite sides. The interconnect parts 263B and 263C have respective left end portions connected to the electrodes 241 and 242 (FIG. 3A), respectively, provided at two ends of the electrically-conductive transparent film 240 of the touchscreen 200 to run along its two opposite sides.

A right end portion of the flexible printed circuit 260 forms the connector part C to be connected to the driver circuit 51. The connector part C, which uses end portions of the interconnect parts 267A, 267C, 267E, and 267F as terminals, is a single-sided terminal having terminals on its upper side (upper surface). The connector part C connects to the driver circuit 51.

The interconnection parts 263 and 267 form the interconnects of the four-wire touchscreen 200 for coordinate detection.

The connector part C is reinforced by the reinforcement part 270 of the flexible printed circuit 260.

Figure 10A:
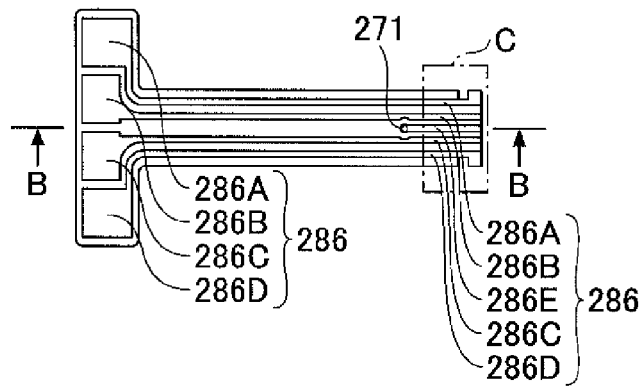
FIGS. 10A through 10C are diagrams illustrating a flexible printed circuit of the comparative example for five-wire touchscreens.
Figure 10B:
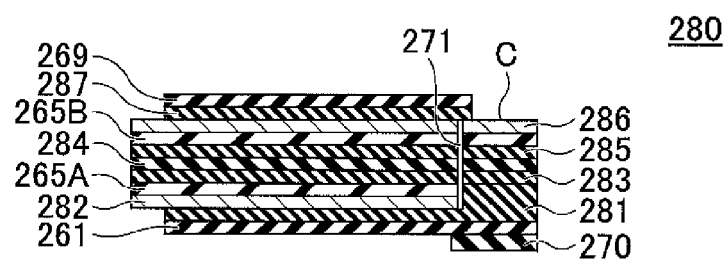
Figure 10C:
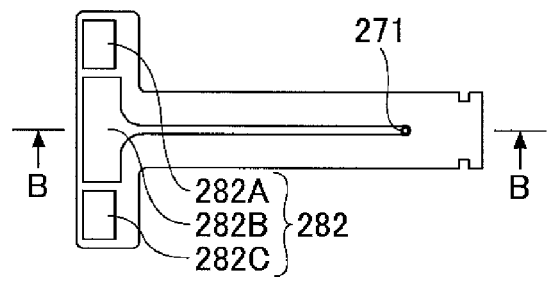

FIGS. 10A through 10C are diagrams illustrating a flexible printed circuit 280 for five-wire touchscreens according to the comparative example. FIG. 10A is a diagram illustrating an interconnection part 286 to connect to the electrically-conductive transparent film 230 of the touchscreen 200. FIG. 10B is a diagram illustrating a cross-sectional structure of the flexible printed circuit 280. FIG. 10C is a diagram illustrating an interconnection part 282 to connect to the electrically-conductive transparent film 240 of the touchscreen 200. FIG. 10B is a cross-sectional view of the flexible printed circuit 280 taken along a plane indicated by arrows B in FIGS. 10A and 10C.

The interconnection part 286 illustrated in FIG. 10A, the cross-sectional structure illustrated in FIG. 10B, and the interconnection part 282 illustrated in FIG. 10C correspond to the interconnection part 267 illustrated in FIG. 9B, the cross-sectional structure illustrated in FIG. 9G, and the interconnection part 263 illustrated in FIG. 9D, respectively. In FIGS. 10A through 10C, the same elements as those of the flexible printed circuit 260 illustrated in FIGS. 9A through 9G are referred to by the same reference numerals, and a description thereof may be omitted.

As illustrated in FIG. 10B, the flexible printed circuit 280 includes the cover film 261, an adhesive layer 281, the interconnection part 282, a base film 265A, an adhesive layer 283, an interconnection part 284, an adhesive layer 285, a base film 265B, the interconnection part 286, an adhesive layer 287, the cover film 269, and the reinforcement part 270.

The cover film 261, which is a flexible film that covers a surface (a lower surface in FIG. 10B) of the interconnection part 282, is formed of, for example, a polyimide film. The cover film 261 is bonded to the interconnection part 282 with the adhesive layer 281.

The adhesive layer 281, which is formed of, for example, an acrylic or epoxy adhesive agent, bonds the cover film 261 and the interconnection part 282 together. The adhesive layer 281 adheres to the adhesive layer 283 above the reinforcement part 270.

The interconnection part 282, which is formed of, for example, copper foil, connects the electrically-conductive transparent film 240 of the five-wire touchscreen 200 and the driver circuit 51 including the coordinates detector circuit 50. As illustrated in FIG. 10C, the interconnection part 282 includes interconnect parts 282A, 282B, and 282C.

Of the interconnect parts 282A through 282C, the interconnect parts 282A and 282C are dummies. The interconnect part 282B is connected to an interconnect part 286E illustrated in FIG. 10A via the through hole 271 at its right end in FIG. 10C.

The base film 265A, which is a film that serves as the base material of the flexible printed circuit 280, is formed of, for example, a polyimide film. The interconnection part 282 is formed on a lower surface of the base film 265A. The interconnection part 284 is bonded to an upper surface of the base film 265A with the adhesive layer 283.

The adhesive layer 283, which is formed of, for example, an acrylic or epoxy adhesive agent, bonds the base film 265A and the interconnection part 284 together.

The interconnection part 284 has its upper surface and lower surface bonded to the base films 265B and 265A with the adhesive layers 285 and 283, respectively. The interconnection part 284 is not connected to the through hole 271.

The adhesive layer 285, which is formed of, for example, an acrylic or epoxy adhesive agent, bonds the interconnection part 284 and the base film 265B together.

The base film 265B is a film that serves as the base material of the flexible printed circuit 280. Like the base film 265A, the base film 265B is formed of, for example, a polyimide film. The interconnection part 286 is formed on an upper surface of the base film 265B. The interconnection part 284 is bonded to a lower surface of the base film 265B with the adhesive layer 285.

The interconnection part 286, which is formed of, for example, copper foil, connects the electrically-conductive transparent film 240 of the five-wire touchscreen 200 and the driver circuit 51 including the coordinates detector circuit 50. As illustrated in FIG. 10A, the interconnection part 286 includes interconnect parts 286A, 286B, 286C, and 286D and the interconnect part 286E.

The interconnect part 286E is connected to the interconnect part 282B illustrated in FIG. 10C via the through hole 271 at its end on the right side in FIG. 10A.

The interconnect parts 286A, 286B, 286C, and 286D are connected to the electrodes 241, 242, 243, and 244, respectively, provided at four ends of the electrically-conductive transparent film 240 to run along its four sides (FIG. 4A).

The adhesive layer 287, which is formed of, for example, an acrylic or epoxy adhesive agent, bonds the interconnection part 286 and the cover film 269 together.

The cover film 269, which is a flexible film that covers a surface (an upper surface in FIG. 10B) of the interconnection part 286, is formed of, for example, a polyimide film. The cover film 269 is bonded to the interconnection part 286 with the adhesive layer 287.

The reinforcement part 270 is bonded to the lower surface of the cover film 261 at its one end (the right end in FIG. 10B). The reinforcement part 270 is formed of, for example, urethane rubber.

The flexible printed circuit 280 illustrated in FIG. 10B has its left end portion (in FIG. 10B) attached by pressure between the film 210 and the glass substrate 220 of the touchscreen 200 (FIG. 1 and FIG. 2).

The interconnection parts 282 and 286 form the interconnects of the five-wire touchscreen 200 for coordinate detection.

The connector part C is reinforced by the reinforcement part 270 of the flexible printed circuit 280.

The flexible printed circuit 280, which uses end portions of the interconnect parts 286A, 286B, 286C, 286D, and 286E illustrated in FIG. 10A as the connector part C, is a single-sided terminal having terminals on its upper side (upper surface).

According to the flexible printed circuit 260 illustrated in FIGS. 9A through 9G and the flexible printed circuit 280 illustrated in FIGS. 10A through 10C, one or more through holes 271 are formed near the connector part C. Therefore, if a stress in a direction to bend the flexible printed circuit 260 or 280 is applied on the connector part C, breakage may occur in the through holes 271 or the connections of the through holes 271 and interconnection parts, so that electrical connections may not be ensured.

There are cases where the touchscreen 200, which is connected to the driver circuit 51 by the flexible printed circuit 260 or 280, does not operate normally if electrical connections are not ensured.

Thus, formation of one or more through holes 271 makes the flexible printed circuits 260 and 280 of the comparative example susceptible to bending, so that there are cases where the electrical connection of an interconnection part is not ensured to cause the malfunction of the touchscreen 200.

According to an aspect of the present invention, a flexible printed circuit and a touchscreen are provided in which on or more of the above-described problems are solved.

[a] First Embodiment

FIGS. 11A through 11H are diagrams illustrating a flexible printed circuit 100 according to a first embodiment.

FIGS. 11A through 11G are plan views of individual layers of the flexible printed circuit 100. FIG. 11E is a cross-sectional view of the flexible printed circuit 100 taken along a plane indicated by arrows C in FIGS. 11A through 11G. The flexible printed circuit 100 is a four-wire type.

As illustrated in FIG. 11H, the flexible printed circuit 100 includes a cover film 101, an adhesive layer 102, an interconnection part 103, an adhesive layer 104, a base film 105, an adhesive layer 106, a reinforcement part 120, an adhesive layer 107, a base film 108, an adhesive layer 109, an interconnection part 110, an adhesive layer 111, and a cover film 112.

The cover film 101, the adhesive layer 102, the interconnection part 103, the adhesive layer 104, the base film 105, the adhesive layer 106, the reinforcement part 120, the adhesive layer 107, the base film 108, the adhesive layer 109, the interconnection part 110, the adhesive layer 111, and the cover film 112 are stacked in layers in this order.

In the following, a description is given with reference to the touchscreen 200 of the comparative example (FIG. 1 through FIG. 4B).

The flexible printed circuit 100 illustrated in FIG. 11H has its left end portion (in FIG. 11H) attached by pressure between the upper electrode substrate 10 and the lower electrode substrate 20 of the touchscreen 200 (FIG. 1, FIG. 2, and FIG. 7). The thickness of at least one of the adhesive layer 102, the adhesive layer 104, the base film 105, the adhesive layer 106, the adhesive layer 107, the base film 108, the adhesive layer 109, and the adhesive layer 111 is adjusted so that the thickness of the left end portion of the flexible printed circuit 100 matches the interval between the electrically-conductive transparent films 230 and 240 of the touchscreen 200.

The cover film 101, which is a flexible film that covers a surface (a lower surface in FIG. 11H) of the interconnection part 103, is formed of, for example, a polyimide film. The cover film 101 is bonded to the interconnection part 103 with the adhesive layer 102. As illustrated in FIG. 11G, the cover film 101 has a T-letter shape in a plan view.

The cover film 101 has an overall length A2, which is smaller than an overall length A1 of the flexible printed circuit 100 (FIG. 11G). Referring to FIG. 11G, the cover film 101 is shorter by a length A3 on the left end side and by a length A4 on the right end side than the flexible printed circuit 100 in order to expose the interconnection part 103.

The adhesive layer 102, which is formed of, for example, an acrylic or epoxy adhesive agent, bonds the cover film 101 and the interconnection part 103 together.

The interconnection part 103, which is formed of, for example, copper foil, connects the electrically-conductive transparent film 240 of the touchscreen 200 and the driver circuit 51 including the coordinates detector circuit 50. As illustrated in FIG. 11F, the interconnection part 103 includes four interconnect parts 103A, 103B, 103C, and 103D. Of the interconnect parts 103A through 103D, the interconnect parts 103A and 103C are dummies. As illustrated in FIG. 11F, the interconnect parts 103B and 103D extend (are elongated) from the left end side to the right end side to have the same or substantially the same length as the overall length A1 of the flexible printed circuit 100. The portions of the interconnect parts 103B and 103D indicated by a one-dot chain line on the right end side in FIG. 11F form a connector part 130A.

The adhesive layer 104, which is formed of, for example, an acrylic or epoxy adhesive agent, bonds the interconnection part 103 and the base film 105 together.

The base film 105, which is a flexible film that serves as the base material of the flexible printed circuit 100, is formed of, for example, a polyimide film. The interconnection part 103 is bonded to the lower surface of the base film 105 with the adhesive layer 104. The reinforcement member 120 is bonded to a portion of the upper surface of the base film 105 on the right end side with the adhesive layer 106. Further, the remaining portion of the upper surface of the base film 105, that is, a portion of the upper surface of the base film 105 that is not bonded to the reinforcement part 120, is bonded to the base film 108 with the adhesive layers 106 and 107. As illustrated in FIG. 11E, the base film 105 has a T-letter shape in a plan view.

The adhesive layer 106 is formed of, for example, an acrylic or epoxy adhesive agent. A right end portion of the adhesive layer 106 bonds the base film 105 and the reinforcement part 120 together. Except for the right end portion that bonds the base film 105 and the reinforcement part 120 together, the adhesive layer 106 is bonded to the adhesive layer 107.

The reinforcement part 120 is bonded to the base film 105 and the base film 108 with the adhesive layer 106 and the adhesive layer 107, respectively, in the right end portion of the flexible printed circuit 100 in which the connector part 130A is formed.

The reinforcement part 120, which is provided to reinforce the connector part 130A, is formed of, for example, urethane rubber.

As illustrated in FIG. 11H, the right end (end face) of the reinforcement part 120 is flush or substantially flush with the right ends (end faces) of the interconnection part 103, the adhesive layer 104, the base film 105, the adhesive layer 106, the adhesive layer 107, the base film 108, the adhesive layer 109, and the interconnection part 110. That is, the end faces of the reinforcement part 120, the interconnection part 103, the adhesive layer 104, the base film 105, the adhesive layer 106, the adhesive layer 107, the base film 108, the adhesive layer 109, and the interconnection part 110 may define a planar or substantially planar end face 100a of the flexible printed circuit 100.

As illustrated in FIG. 11D, the reinforcement part 120 has a length A5. The length A5 of the reinforcement part 120 is greater than the length A4 of the connector part 130A where the interconnection part 103 is exposed. That is, the reinforcement part 120 and the cover films 101 and 112 overlap each other in the lengthwise directions of the flexible printed circuit 100. For example, an end portion 120a of the reinforcement part 120 facing toward the inside of the flexible printed circuit 100 includes an overlapping portion that overlaps the cover films 101 and 112 in a plan view (that is, a view in a layer stacking direction of the flexible printed circuit 100) of the flexible printed circuit 100.

The adhesive layer 107 is formed of, for example, an acrylic or epoxy adhesive agent. A right end portion of the adhesive layer 107 bonds the base film 108 and the reinforcement part 120 together. Except for the right end portion that bonds the base film 108 and the reinforcement part 120 together, the adhesive layer 107 is bonded to the adhesive layer 106.

The base film 108, which is a flexible film that serves as the base material of the flexible printed circuit 100, is formed of, for example, a polyimide film. The reinforcement member 120 is bonded to a portion of the lower surface of the base film 108 on the right end side with the adhesive layer 107. Further, the remaining portion of the lower surface of the base film 108, that is, a portion of the lower surface of the base film 108 that is not bonded to the reinforcement part 120, is bonded to the base film 105 with the adhesive layers 107 and 106.

The upper surface of the base film 108 is bonded to the interconnection part 110 with the adhesive layer 109. As illustrated in FIG. 11C, the base film 108 has a T-letter shape in a plan view.

The adhesive layer 109, which is formed of, for example, an acrylic or epoxy adhesive agent, bonds the base film 108 and the interconnection part 110 together.

The interconnection part 110, which is formed of, for example, copper foil, connects the electrically-conductive transparent film 230 of the touchscreen 200 and the driver circuit 51 including the coordinates detector circuit 50. As illustrated in FIG. 11B, the interconnection part 110 includes four interconnect parts 110A, 110B, 110C, and 110D.

Of the interconnect parts 110A through 110D, the interconnect parts 110B and 110D are dummy terminals. As illustrated in FIG. 11B, the interconnect parts 110A and 110C extend (are elongated) from the left end side to the right end side to have the same or substantially the same length as the overall length A1 of the flexible printed circuit 100. The portions of the interconnect parts 110A and 110C indicated by a one-dot chain line on the right end side in FIG. 11B form a connector part 130B.

The adhesive layer 111, which is formed of, for example, an acrylic or epoxy adhesive agent, bonds the interconnection part 110 and the cover film 112 together.

The cover film 112, which is a flexible film that covers a surface (an upper surface in FIG. 11H) of the interconnection part 110, is formed of, for example, a polyimide film. The cover film 112 is bonded to the interconnection part 110 with the adhesive layer 111. As illustrated in FIG. 11A, the cover film 112 has a T-letter shape in a plan view.

The interconnect parts 110A and 110C have respective left end portions connected to the electrodes 231 and 232 (FIG. 3A), respectively, provided at two ends of the electrically-conductive transparent film 230 of the touchscreen 200 to run along its two opposite sides. The interconnect parts 103B and 103D have respective left end portions connected to the electrodes 241 and 242 (FIG. 3A), respectively, provided at two ends of the electrically-conductive transparent film 240 of the touchscreen 200 to run along its two opposite sides.

Thus, the interconnection parts 103 and 110 form the interconnects of the four-wire touchscreen 200 for coordinate detection.

The flexible printed circuit 100 of the first embodiment is a double-sided contact flexible printed circuit having the connector part 130B and the connector part 130A on the upper surface and the lower surface, respectively, of its right end portion to be connected to the driver circuit 51.

Further, unlike the flexible printed circuits 260 and 280 of the comparative example, the flexible printed circuit 100 does not include through holes.

Therefore, even if a stress in a direction to bend the flexible printed circuit 100 is applied to the flexible printed circuit 100 at its connector part 130A or 130B, the breakage of interconnects is less likely to occur because of absence of through holes.

Further, the connector parts 130A and 130B are formed by exposing end portions of the interconnection parts 103 and 110, respectively, and the reinforcement part 120 is provided between the respective portions of the interconnection parts 103 and 110 forming the connector parts 130A and 130B. The length A5 of the reinforcement part 120 is greater than the length A4 of the connector parts 130A and 130B.

Therefore, according to the first embodiment, the flexible printed circuit 100 is provided in which the breakage of interconnects is less likely to occur even when a force is applied in a direction to bend the flexible printed circuit 100.

Further, the length A5 of the reinforcement part 120 is greater than the length A4 of the connector parts 130A and 130B, where the interconnection parts 103 and 110 are exposed, so that the reinforcement part 120 and the cover films 101 and 112 overlap each other in the lengthwise directions of the flexible printed circuit 100.

Since there is thus an overlap between the reinforcement part 120 and the cover films 101 and 112, the flexible printed circuit 100 is improved in strength against bending stress.

Further, using the flexible printed circuit 100 of the first embodiment makes it possible to provide a touchscreen (or a touchscreen panel) with high reliability.

The above description is given of the configuration where the flexible printed circuit 100 includes the cover film 101, the adhesive layer 102, the interconnection part 103, the adhesive layer 104, the base film 105, the adhesive layer 106, the reinforcement layer 120, the adhesive layer 107, the base film 108, the adhesive layer 109, the interconnection part 110, the adhesive layer 111, and the cover film 112.

However, the flexible printed circuit 100 is not limited to the structure illustrated in FIGS. 11A through 11H, and may have another structure as long as the interconnection parts 103 and 110, provided on the opposite sides of the base film 105, have respective end portions to be connected to the driver circuit 51 exposed in such a manner as to achieve a double-sided contact, that is, exposed on the opposite sides of the flexible printed circuit 100 to serve as contacts, without formation of through holes.

Figure 12:
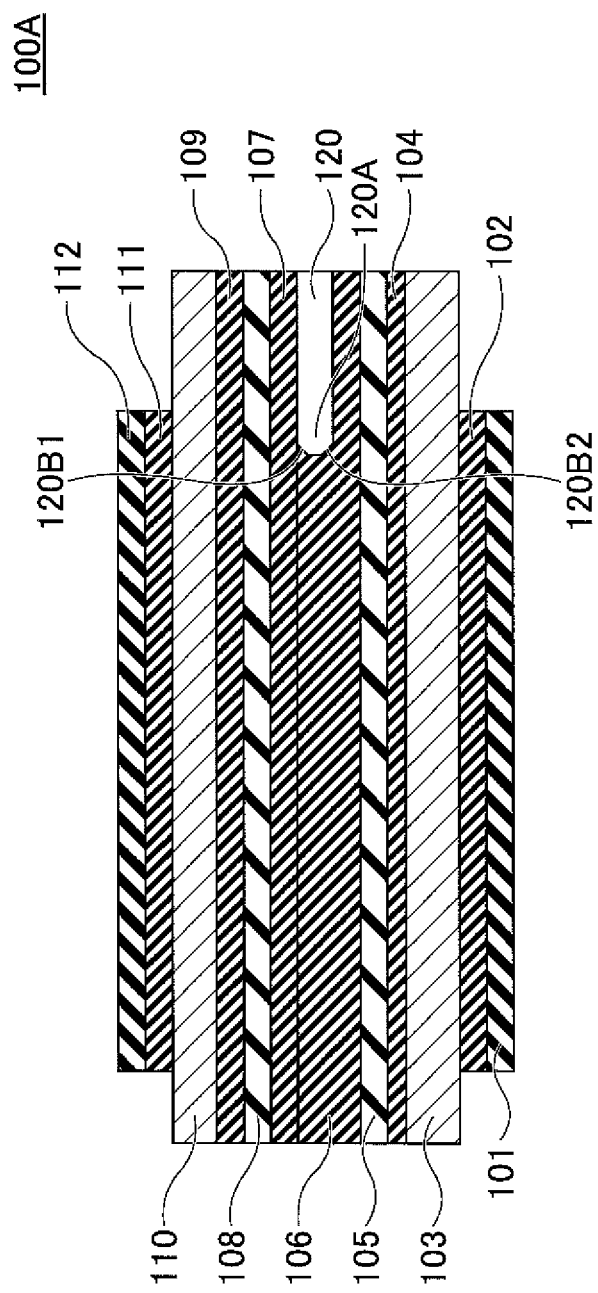
FIG. 12 is a diagram illustrating a cross-sectional structure of a flexible printed circuit according a first variation of the first embodiment.

FIG. 12 is a diagram illustrating a cross-sectional structure of a flexible printed circuit 100A according to a first variation of the first embodiment.

The flexible printed circuit 100A of the first variation of the first embodiment has the same structure as the flexible printed circuit 100 of the first embodiment illustrated in FIGS. 11A through 11H except that an inner end portion 120A of the reinforcement part 120, positioned (facing toward) inside the flexible printed circuit 100A, includes a chamfered portion 120B1 and a chamfered portion 120B2.

The chamfered portion 120B1 is formed by chamfering or rounding the upper-surface-side corner of the inner end portion 120A of the reinforcement part 120 to extend in the widthwise directions of the flexible printed circuit 100A (the directions perpendicular to the length A5 in the plane indicating the reinforcement part 120 in FIG. 11D).

The chamfered portion 120B2 is formed by chamfering or rounding the lower-surface-side corner of the inner end portion 120A of the reinforcement part 120 to extend in the widthwise directions of the flexible printed circuit 100A (the directions perpendicular to the length A5 in the plane indicating the reinforcement part 120 in FIG. 11D).

By thus forming the chamfered portions 120B1 and 120B2 in the inner end portion 120A of the reinforcement part 120, positioned inside the flexible printed circuit 100A, the flexible printed circuit 100A is provided that is far less likely to suffer the breakage of interconnects in response to a stress applied in a direction to bend the flexible printed circuit 100A.

Figure 13:
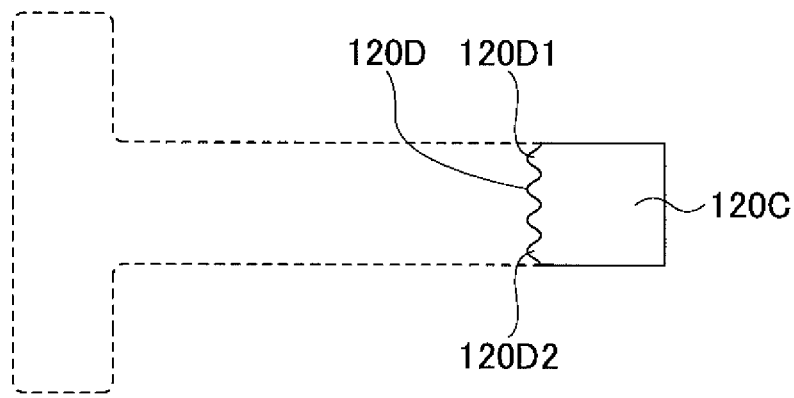
FIG. 13 is a diagram illustrating a planar structure of a reinforcement part according to a second variation of the first embodiment.

FIG. 13 is a diagram illustrating a planar structure of a reinforcement part 120C according to a second variation of the first embodiment. FIG. 13 is a plan view corresponding to FIG. 11D.

Reference may be made to the flexible printed circuit 100 of the first embodiment in giving a description of the reinforcement part 120C of the second variation of the first embodiment.

According to the second variation, an inner end portion 120D of the reinforcement part 120C, positioned (facing toward) inside the flexile printed circuit 100, is corrugated or has a corrugated edge in a plan view. For example, the inner end portion 120D may have an corrugated end face.

The corrugated shape of the inner end portion 120D is not limited to the one illustrated in FIG. 13, and the inner end portion 120D may have another corrugated shape as long as both end portions 120D1 and 120D2 of the end portion 120D in the widthwise direction of the flexible printed circuit 100 are rounded into a curved shape.

By thus forming the inner end portion 120D of the reinforcement part 120C, positioned inside the flexible printed circuit 100, into a curved shape, the flexible printed circuit 100 is provided that is far less likely to suffer the breakage of interconnects in response to a stress applied in a direction to bend the flexible printed circuit 100.

[b] Second Embodiment

Figure 14A:
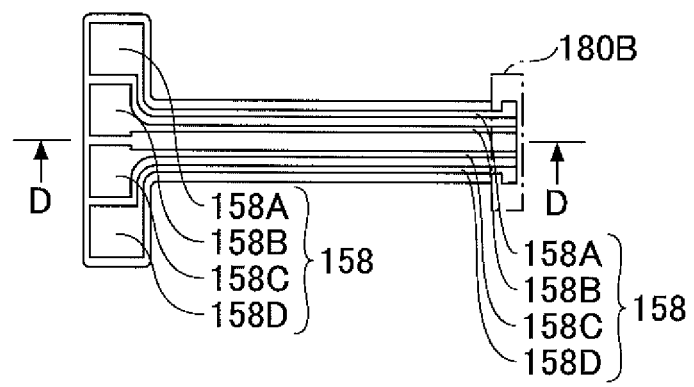
FIGS. 14A through 14C are diagrams illustrating a flexible printed circuit for five-wire touchscreens according to the second embodiment.
Figure 14B:
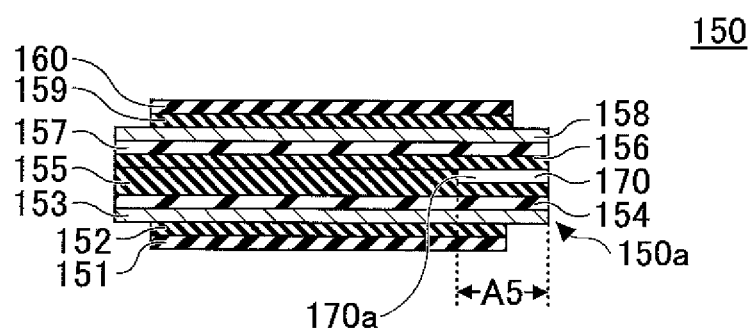
Figure 14C:
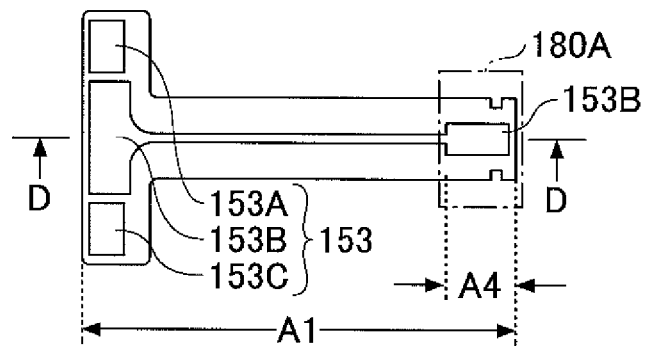

FIGS. 14A through 14C are diagrams illustrating a flexible printed circuit 150 for five-wire touchscreens according to a second embodiment. FIG. 14A is a diagram illustrating an interconnection part 158 to be connected to the electrically-conductive transparent film 230 of the touchscreen 200. FIG. 14B is a diagram illustrating a cross-sectional structure of the flexible printed circuit 150. FIG. 14C is a diagram illustrating an interconnection part 153 to be connected to the electrically-conductive transparent film 240 of the touchscreen 200. FIG. 14B is a cross-sectional view of the flexible printed circuit 150 taken along a plane indicated by arrows D in FIGS. 14A and 14C.

The interconnection part 158 illustrated in FIG. 14A, the cross-sectional structure illustrated in FIG. 14B, and the interconnection part 153 illustrated in FIG. 14C correspond to the interconnection part 286 illustrated in FIG. 10A, the cross-sectional structure illustrated in FIG. 10B, and the interconnection part 282 illustrated in FIG. 10C, respectively.

As illustrated in FIG. 14B, the flexible printed circuit 150 includes a cover film 151, an adhesive layer 152, an interconnection part 153, a base film 154, an adhesive layer 155, a reinforcement part 170, an adhesive layer 156, a base film 157, an interconnection part 158, an adhesive layer 159, and a cover film 160.

The cover film 151, which is a flexible film that covers a surface (a lower surface in FIG. 143) of the interconnection part 153, is formed of, for example, a polyimide film. The cover film 151 is bonded to the interconnection part 153 with the adhesive layer 152.

The adhesive layer 152, which is formed of, for example, an acrylic or epoxy adhesive agent, bonds the cover film 151 and the interconnection part 153 together.

The interconnection part 153, which is formed of, for example, copper foil, connects the electrically-conductive transparent film 230 of the five-wire touchscreen 200 and the driver circuit 51 including the coordinates detector circuit 50. As illustrated in FIG. 14C, the interconnection part 153 includes four interconnect parts 153A, 153B, and 153C.

Of the interconnect parts 153A through 153C, the interconnect parts 153A and 153C are dummies. As illustrated in FIG. 14C, the interconnect part 153E extends from the left end side to the right end side to have the same or substantially the same length as an overall length A1 of the flexible printed circuit 150. The portion of the interconnect part 153B indicated by a one-dot chain line on the right end side in FIG. 14C forms a connector part 180A.

The base film 154, which is a flexible film that serves as the base material of the flexible printed circuit 150, is formed of, for example, a polyimide film. The interconnection part 153 is formed on the lower surface of the base film 105. The adhesive layer 155 is bonded to the upper surface of the base film 154.

The adhesive layer 155 is formed of, for example, an acrylic or epoxy adhesive agent. The lower surface of the adhesive layer 155 is bonded to the base film 154. A portion of the upper surface of the adhesive layer 155 on the right end side is bonded to the reinforcement part 170. Further, the remaining portion of the upper surface of the adhesive layer 155, that is, a portion of the upper surface of the adhesive layer 155 that is not bonded to the reinforcement part 170, is bonded to the adhesive layer 156.

The reinforcement part 170 is bonded to the base film 154 and the base film 157 with the adhesive layer 155 and the adhesive layer 156, respectively, in the right end portion of the flexible printed circuit 150 in which the connector part 180A is formed.

The reinforcement part 170, which is provided to reinforce the connector part 180A, is formed of, for example, urethane rubber.

As illustrated in FIG. 14B, the right end (end face) of the reinforcement part 170 is flush or substantially flush with the right ends (end faces) of the interconnection part 153, the base film 154, the adhesive layer 155, the adhesive layer 156, the base film 157, and the interconnection part 158. That is, the end faces of the reinforcement part 170, the interconnection part 153, the base film 154, the adhesive layer 155, the adhesive layer 156, the base film 157, and the interconnection part 158 may define a planar or substantially planar end face 150a of the flexible printed circuit 150.

As illustrated in FIG. 14B, the reinforcement part 170 has a length A5. The length A5 of the reinforcement part 170 is greater than a length A4 of the connector part 180A where the interconnection part 153 is exposed.

The adhesive layer 156 is formed of, for example, an acrylic or epoxy adhesive agent. The upper surface of the adhesive layer 156 is bonded to the base film 157. A right end portion of the lower surface of the adhesive layer 156 is bonded to the reinforcement part 170. Except for the right end portion that bonds to the reinforcement part 170, the lower surface of the adhesive layer 156 is bonded to the adhesive layer 155.

The base film 157 is a flexible film that serves as the base material of the flexible printed circuit 150. Like the base film 154, the base film 157 is formed of, for example, a polyimide film. The interconnection part 158 is formed on the upper surface of the base film 157. The lower surface of the base film 157 is bonded to the adhesive layer 156.

The interconnection part 158, which is formed of, for example, copper foil, connects the electrically-conductive transparent film 240 of the five-wire touchscreen 200 and the driver circuit 51 including the coordinates detector circuit 50. As illustrated in FIG. 14A, the interconnection part 158 includes interconnect parts 158A, 158B, 158C, and 158D.

The interconnect parts 158A, 158B, 158C, and 158D are connected to the electrodes 241, 242, 243, and 244, respectively, provided at four ends of the electrically-conductive transparent film 240 to run along its four sides.

As illustrated in FIG. 14A, the interconnect parts 158A, 158B, 158C, and 158D extend (are elongated) from the left end side to the right end side to have the same or substantially the same length as the overall length A1 of the flexible printed circuit 150. The portions of the interconnect parts 158A, 158B, 158C, and 158D indicated by a one-dot chain line on the right end side in FIG. 14A form a connector part 180B.

The adhesive layer 159, which is formed of, for example, an acrylic or epoxy adhesive agent, bonds the interconnection part 158 and the cover film 160 together.

The cover film 160, which is a flexible film that covers a surface (an upper surface in FIG. 14C) of the interconnection part 158, is formed of, for example, a polyimide film. The cover film 160 is bonded to the interconnection part 158 with the adhesive layer 159.

The flexible printed circuit 150 illustrated in FIG. 14B has its left end portion (in FIG. 14B) attached by pressure between the upper electrode substrate 10 and the lower electrode substrate 20 of the touchscreen 200 (FIG. 1, FIG. 2, and FIG. 7). The thickness of at least one of the adhesive layer 152, the base film 154, the adhesive layer 155, the adhesive layer 156, the base film 157, and the adhesive layer 159 is adjusted so that the thickness of the left end portion of the flexible printed circuit 150 matches the interval between the electrically-conductive transparent films 230 and 240 of the touchscreen 200.

The interconnect part 153E and the interconnect parts 158A, 158B, 158C, and 158D form the interconnects of the five-wire touchscreen 200 for coordinate detection.

The flexible printed circuit 150 of the second embodiment is a double-sided contact flexible printed circuit having the connector part 180B and the connector part 180A on the upper surface and the lower surface, respectively, of its right end portion to be connected to the driver circuit 51.

Further, unlike the flexible printed circuits 260 and 280 of the comparative example, the flexible printed circuit 150 does not include through holes.

Therefore, even if a stress in a direction to bend the flexible printed circuit 150 is applied to the flexible printed circuit 150 at its connector part 180A or 180B, the breakage of interconnects is less likely to occur because of absence of through holes.

Further, the connector parts 180A and 180B are formed by exposing an end portion of the interconnect part 153B and end portions of the interconnect parts 158A, 158B, 158C, and 158D, respectively, and the reinforcement part 170 is provided between the portion of the interconnect part 153B forming the connector part 180A and the portions of the interconnect parts 158A, 158B, 158C, and 158D forming the connector part 180B. The length A5 of the reinforcement part 170 is greater than the length A4 of the connector parts 180A and 180B.

Therefore, according to the second embodiment, the flexible printed circuit 150 is provided in which the breakage of interconnects is less likely to occur even when a force is applied in a direction to bend the flexible printed circuit 150.

Further, the length A5 of the reinforcement part 170 is greater than the length A4 of the connector parts 180A and 180B, where the interconnection parts 153 and 158 are exposed, so that the reinforcement part 170 and the cover films 151 and 160 overlap each other in the lengthwise directions of the flexible printed circuit 150. For example, an end portion 170a of the reinforcement part 170 facing toward the inside of the flexible printed circuit 150 includes an overlapping portion that overlaps the cover films 151 and 160 in a plan view (that is, a view in a layer stacking direction of the flexible printed circuit 150) of the flexible printed circuit 150.

Since there is thus an overlap between the reinforcement part 170 and the cover films 151 and 160, the flexible printed circuit 150 is improved in strength against bending stress.

Further, using the flexible printed circuit 150 of the second embodiment makes it possible to provide a touchscreen (or a touchscreen panel) with high reliability.

Like the flexible printed circuit 100 of the first embodiment, the flexible printed circuit 150 of the second embodiment may also include a chamfered portion in an inner end portion of the reinforcement part 170 positioned inside the flexible printed circuit 150 (as in the first variation of the first embodiment) or have the inner end portion of the reinforcement part 170 formed into a curved shape (as in the second variation of the first embodiment).

The above description is given of a five-wire touchscreen. Meanwhile, in the case of using a touchscreen having an electrically-conducive transparent film divided into multiple electrically conductive regions as illustrated in FIG. 5, multiple interconnect parts 153B may be provided in accordance with the number of electrically conductive regions.

All examples and conditional language provided herein are intended for pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority or inferiority of the invention. Although one or more embodiments of the present invention have been described in detail, it should be understood that the various changes, substitutions, and alterations could be made hereto without departing from the spirit and scope of the invention.

What is claimed is:

1. A flexible printed circuit, comprising:
   a first flexible film;
   a first interconnection layer on the first flexible film, wherein the first interconnection layer includes a first end portion to be connected to a first electrode of a touchscreen, and a second end portion;
   a second flexible film;
   a second interconnection layer on the second flexible film, wherein the second interconnection layer includes a first end portion to be connected to a second electrode of the touchscreen, and a second portion;
   an adhesive layer that bonds the first flexible film and the second flexible film;
   a first cover film on the first interconnection layer with the first and second end portions of the first interconnection layer being exposed; and
   a second cover film on the second interconnection layer with the first and second end portions of the second interconnection layer being exposed.

2. The flexible printed circuit as claimed in claim 1, further comprising:
   a reinforcement part provided between the first flexible film and the second flexible film in an end portion of the flexible printed circuit including the second end portions of the first and second interconnection layers.

3. The flexible printed circuit as claimed in claim 2, wherein the reinforcement part includes an end portion facing toward an inside of the flexible printed circuit, and the end portion includes a chamfered portion formed in a direction perpendicular to a direction from the first end portions to the second end portions of the first and second interconnection layers.

4. The flexible printed circuit as claimed in claim 2, wherein the reinforcement part includes an end portion facing toward an inside of the flexible printed circuit, and the end portion includes an overlapping portion that overlaps the first and second cover films in a plan view of the flexible printed circuit.

5. The flexible printed circuit as claimed in claim 2, wherein the reinforcement part includes an end portion facing toward an inside of the flexible printed circuit, and the end portion has a curved shape in a plan view of the flexible printed circuit.

6. The flexible printed circuit as claimed in claim 1, wherein a thickness of the first flexible film, the second flexible film, or the adhesive layer is adjusted so that a thickness of an end portion of the flexible printed circuit to be connected to the touchscreen matches an interval between the first electrode and the second electrode of the touchscreen.

7. A touchscreen, comprising:
   a flexible printed circuit;
   a first electrode substrate that includes a first substrate and a first electrode formed on the first substrate; and
   a second electrode substrate that includes a second substrate and a second electrode formed on the second substrate,
   wherein the flexible printed circuit includes
   a first flexible film;
   a first interconnection layer on the first flexible film, wherein the first interconnection layer includes a first end portion connected to the first electrode, and a second end portion;
   a second flexible film;
   a second interconnection layer on the second flexible film, wherein the second interconnection layer includes a first end portion connected to the second electrode, and a second portion;
   an adhesive layer that bonds the first flexible film and the second flexible film;
   a first cover film on the first interconnection layer with the first and second end portions of the first interconnection layer being exposed; and
   a second cover film on the second interconnection layer with the first and second end portions of the second interconnection layer being exposed.

8. The touchscreen as claimed in claim 7, wherein the first electrode comprises an electrically conductive film divided into a plurality of electrically conductive regions.

* * * * *